US012002727B2

United States Patent
Lin et al.

(10) Patent No.: US 12,002,727 B2
(45) Date of Patent: Jun. 4, 2024

(54) BARRIER STRUCTURES FOR UNDERFILL CONTAINMENT

(71) Applicant: INTEL CORPORATION, Santa Clara, CA (US)

(72) Inventors: Ziyin Lin, Chandler, AZ (US); Vipul Mehta, Chandler, AZ (US); Wei Li, Chandler, AZ (US); Edvin Cetegen, Chandler, AZ (US); Xavier Brun, Hillsboro, OR (US); Yang Guo, Chandler, AZ (US); Soud Choudhury, Chandler, AZ (US); Shan Zhong, Chandler, AZ (US); Christopher Rumer, Chander, AZ (US); Nai-Yuan Liu, Chandler, AZ (US); Ifeanyi Okafor, Chandler, AZ (US); Hsin-Wei Wang, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 889 days.

(21) Appl. No.: 16/788,186

(22) Filed: Feb. 11, 2020

(65) Prior Publication Data
US 2021/0249322 A1 Aug. 12, 2021

(51) Int. Cl.
*H01L 23/31* (2006.01)
*H01L 23/00* (2006.01)
*H01L 23/367* (2006.01)

(52) U.S. Cl.
CPC ...... *H01L 23/3185* (2013.01); *H01L 23/3675* (2013.01); *H01L 23/562* (2013.01); *H01L 24/16* (2013.01); *H01L 2224/16227* (2013.01); *H01L 2924/18161* (2013.01); *H01L 2924/35121* (2013.01)

(58) Field of Classification Search
CPC ............ H01L 23/3185; H01L 23/3675; H01L 23/562
See application file for complete search history.

(56) References Cited

U.S. PATENT DOCUMENTS

| | | | |
|---|---|---|---|
| 9,245,865 B1* | 1/2016 | Kwon | H01L 24/32 |
| 2003/0062613 A1* | 4/2003 | Masumoto | H01L 29/0657 |
| | | | 257/E29.022 |
| 2013/0043581 A1* | 2/2013 | Negoro | H01L 23/36 |
| | | | 257/E23.08 |
| 2018/0190560 A1* | 7/2018 | Li | H01L 24/81 |

* cited by examiner

*Primary Examiner* — Errol V Fernandes
(74) *Attorney, Agent, or Firm* — Essential Patents Group, LLP (57) ABSTRACT

An integrated circuit assembly may be formed comprising an electronic substrate, a first and second integrated circuit device each having a first surface, a second surface, at least one side extending between the first and second surface, and an edge defined at an intersection of the second surface and the at least one side of each respective integrated circuit device, wherein the first surface of each integrated circuit device is electrically attached to the electronic substrate, an underfill material between the first surface of each integrated circuit device and the electronic substrate, and between the sides of the first and second integrated circuit devices, and at least one barrier structure adjacent at least one of the edge of first integrated circuit device and the edge of the second integrated circuit device, wherein the underfill material abuts the at least one barrier structure.

13 Claims, 8 Drawing Sheets

BARRIER STRUCTURES FOR UNDERFILL CONTAINMENT

TECHNICAL FIELD

Embodiments of the present description generally relate to the field of integrated circuit package fabrication, and, more specifically, to an integrated circuit assembly including a height difference between at least two integrated circuit devices within the integrated circuit assembly, wherein at least one of the two integrated circuit devices includes a barrier structure to contain the spread of underfill material.

BACKGROUND

The integrated circuit industry is continually striving to produce ever faster, smaller, and thinner integrated circuit devices and packages for use in various electronic products, including, but not limited to, computer servers and portable products, such as portable computers, electronic tablets, cellular phones, digital cameras, and the like.

As these goals are achieved, the integrated circuit devices become smaller. Accordingly, the density of power consumption of electronic components within the integrated circuit devices has increased, which, in turn, increases the average junction temperature of the integrated circuit device. If the temperature of the integrated circuit device becomes too high, the integrated circuits may be damaged or destroyed. Thus, heat dissipation devices are used to remove heat from the integrated circuit devices in an integrated circuit package. In one example, at least one integrated circuit device may be mounted to a substrate and the heat dissipation device may be attached to the substrate and extend over the integrated circuit device(s) to form the integrated circuit package. The distance between the integrated circuit device(s) and the heat dissipation device is known as the bond line thickness.

Generally, a thermal interface material is disposed between the integrated circuit device(s) and the heat dissipation device to form thermal contact therebetween. The thermal interface material primarily serves two functions: 1) to provide a heat transfer path from the integrated circuit device(s) to the heat dissipation device, and 2) to help absorb stresses in the integrated circuit package caused by differing thermal expansions between the components therein. With regard to providing a heat transfer path, the thermal efficiency of the thermal interface material is critical to effectively remove heat from the integrated circuit device(s). Thus, it is important that the thermal interface material makes good contact with the integrated circuit devices. Furthermore, it is important to prevent "failure modes". These failure modes can include voiding, which can result in delamination from the heat dissipation device and/or the integrated circuit device(s); hardening, which can lead to loss of adhesion that can also result in delamination from the heat dissipation device and/or the integrated circuit devices; and pump-out, where the thermal interface material physically moves out from between the heat dissipation device and the integrated circuit device(s). The thermomechanical stresses that cause failure modes result from temperature cycles during the operation of the integrated circuit package. The temperature cycles cause warpage in integrated circuit device(s) within the integrated circuit package when it heats and cools during operation. For example, in a standard integrated circuit package with one integrated circuit device, the heat dissipation device bottoms out at approximately the center of the integrated circuit device, due to the integrated circuit device's natural convex shape at room temperature. When the integrated circuit package is exposed to temperature gradients, the shape of the integrated circuit device changes from convex to flat or concave, which causes compression on the thermal interface material at edges or sidewalls of the integrated circuit device. When the integrated circuit package returns to room temperature, the integrated circuit device returns to a convex shape creating an elongation of the thermal interface material at the edge or sidewalls of the integrated circuit device. The mechanisms of compression and elongation may cause the previously discussed failure modes.

BRIEF DESCRIPTION OF THE DRAWINGS

The subject matter of the present disclosure is particularly pointed out and distinctly claimed in the concluding portion of the specification. The foregoing and other features of the present disclosure will become more fully apparent from the following description and appended claims, taken in conjunction with the accompanying drawings. It is understood that the accompanying drawings depict only several embodiments in accordance with the present disclosure and are, therefore, not to be considered limiting of its scope. The disclosure will be described with additional specificity and detail through use of the accompanying drawings, such that the advantages of the present disclosure can be more readily ascertained, in which:

DETAILED DESCRIPTION

In the following detailed description, reference is made to the accompanying drawings that show, by way of illustration, specific embodiments in which the claimed subject matter may be practiced. These embodiments are described in sufficient detail to enable those skilled in the art to practice the subject matter. It is to be understood that the various embodiments, although different, are not necessarily mutually exclusive. For example, a particular feature, structure, or characteristic described herein, in connection with one embodiment, may be implemented within other embodiments without departing from the spirit and scope of the claimed subject matter. References within this specification to "one embodiment" or "an embodiment" mean that a particular feature, structure, or characteristic described in connection with the embodiment is included in at least one implementation encompassed within the present description. Therefore, the use of the phrase "one embodiment" or "in an embodiment" does not necessarily refer to the same embodiment. In addition, it is to be understood that the location or arrangement of individual elements within each disclosed embodiment may be modified without departing from the spirit and scope of the claimed subject matter. The following detailed description is, therefore, not to be taken in a limiting sense, and the scope of the subject matter is defined only by the appended claims, appropriately interpreted, along with the full range of equivalents to which the appended claims are entitled. In the drawings, like numerals refer to the same or similar elements or functionality throughout the several views, and that elements depicted therein are not necessarily to scale with one another, rather individual elements may be enlarged or reduced in order to more easily comprehend the elements in the context of the present description.

The terms "over", "to", "between" and "on" as used herein may refer to a relative position of one layer with respect to other layers. One layer "over" or "on" another layer or bonded "to" another layer may be directly in contact with the other layer or may have one or more intervening layers. One layer "between" layers may be directly in contact with the layers or may have one or more intervening layers.

The term "package" generally refers to a self-contained carrier of one or more dice, where the dice are attached to the package substrate, and may be encapsulated for protection, with integrated or wire-bonded interconnects between the dice and leads, pins or bumps located on the external portions of the package substrate. The package may contain a single die, or multiple dice, providing a specific function. The package is usually mounted on a printed circuit board for interconnection with other packaged integrated circuits and discrete components, forming a larger circuit.

Here, the term "cored" generally refers to a substrate of an integrated circuit package built upon a board, card or wafer comprising a non-flexible stiff material. Typically, a small printed circuit board is used as a core, upon which integrated circuit device and discrete passive components may be soldered. Typically, the core has vias extending from one side to the other, allowing circuitry on one side of the core to be coupled directly to circuitry on the opposite side of the core. The core may also serve as a platform for building up layers of conductors and dielectric materials.

Here, the term "coreless" generally refers to a substrate of an integrated circuit package having no core. The lack of a core allows for higher-density package architectures, as the through-vias have relatively large dimensions and pitch compared to high-density interconnects.

Here, the term "land side", if used herein, generally refers to the side of the substrate of the integrated circuit package closest to the plane of attachment to a printed circuit board, motherboard, or other package. This is in contrast to the term "die side", which is the side of the substrate of the integrated circuit package to which the die or dice are attached.

Here, the term "dielectric" generally refers to any number of non-electrically conductive materials that make up the structure of a package substrate. For purposes of this disclosure, dielectric material may be incorporated into an integrated circuit package as layers of laminate film or as a resin molded over integrated circuit dice mounted on the substrate.

Here, the term "metallization" generally refers to metal layers formed over and through the dielectric material of the package substrate. The metal layers are generally patterned to form metal structures such as traces and bond pads. The metallization of a package substrate may be confined to a single layer or in multiple layers separated by layers of dielectric.

Here, the term "bond pad" generally refers to metallization structures that terminate integrated traces and vias in integrated circuit packages and dies. The term "solder pad" may be occasionally substituted for "bond pad" and carries the same meaning.

Here, the term "solder bump" generally refers to a solder layer formed on a bond pad. The solder layer typically has a round shape, hence the term "solder bump".

Here, the term "substrate" generally refers to a planar platform comprising dielectric and metallization structures. The substrate mechanically supports and electrically couples one or more IC dies on a single platform, with encapsulation of the one or more IC dies by a moldable dielectric material. The substrate generally comprises solder bumps as bonding interconnects on both sides. One side of the substrate, generally referred to as the "die side", comprises solder bumps for chip or die bonding. The opposite side of the substrate, generally referred to as the "land side", comprises solder bumps for bonding the package to a printed circuit board.

Here, the term "assembly" generally refers to a grouping of parts into a single functional unit. The parts may be separate and are mechanically assembled into a functional unit, where the parts may be removable. In another instance, the parts may be permanently bonded together. In some instances, the parts are integrated together.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, magnetic or fluidic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The vertical orientation is in the z-direction and it is understood that recitations of "top", "bottom", "above" and "below" refer to relative positions in the z-dimension with the usual meaning. However, it is understood that embodiments are not necessarily limited to the orientations or configurations illustrated in the figure.

The terms "substantially," "close," "approximately," "near," and "about," generally refer to being within +/−10% of a target value (unless specifically specified). Unless otherwise specified the use of the ordinal adjectives "first," "second," and "third," etc., to describe a common object, merely indicate that different instances of like objects to which are being referred and are not intended to imply that the objects so described must be in a given sequence, either temporally, spatially, in ranking or in any other manner.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C).

Views labeled "cross-sectional", "profile" and "plan" correspond to orthogonal planes within a cartesian coordinate system. Thus, cross-sectional and profile views are taken in the x-z plane, and plan views are taken in the x-y plane. Typically, profile views in the x-z plane are cross-sectional views. Where appropriate, drawings are labeled with axes to indicate the orientation of the figure.

Embodiments of the present description relate to the used of barrier structures to prevent the flow of underfill material onto back surfaces of integrated circuit devices in integrated circuit packages/assemblies. In one embodiment, an integrated circuit assembly may comprise an electronic substrate, a first and second integrated circuit device each having a first surface, a second surface, at least one side extending between the first and second surface, and an edge defined at an intersection of the second surface and the at least one side of each respective integrated circuit device, wherein the first surface of each integrated circuit device is electrically attached to the electronic substrate, an underfill material between the first surface of each integrated circuit device and the electronic substrate, and between the sides of the first and second integrated circuit devices, and at least one barrier structure adjacent at least one of the edge of first integrated circuit device and the edge of the second integrated circuit device, wherein the underfill material abuts the at least one barrier structure.

Figure 1:
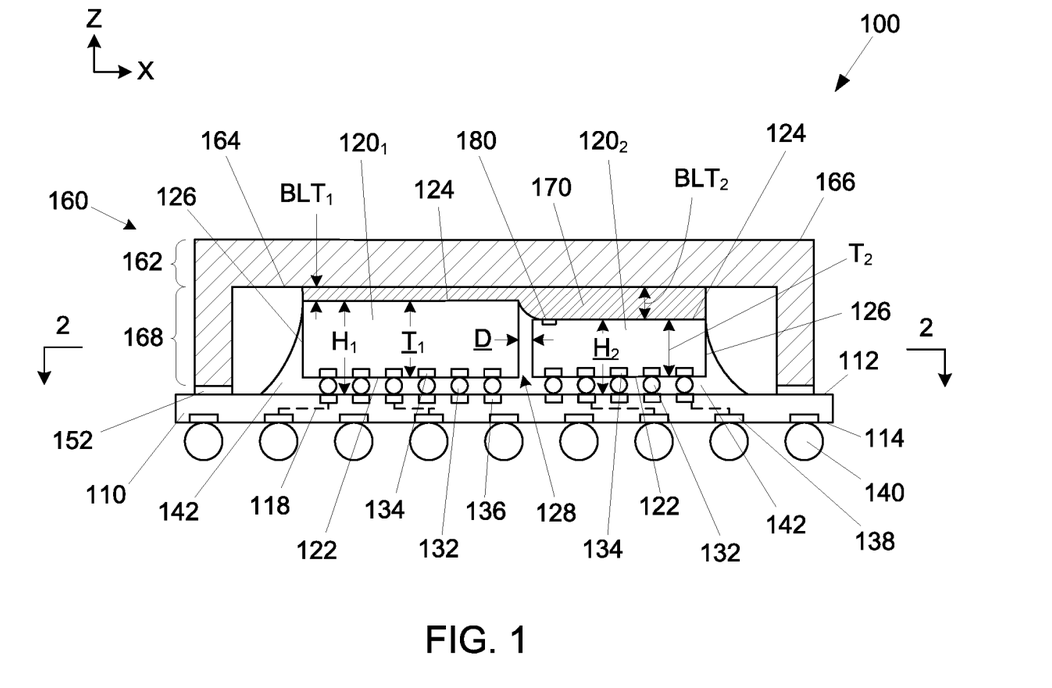
FIG. 1 is a side cross-sectional view of an integrated circuit assembly, according to one embodiment of the present description.

FIG. 1 illustrates an integrated circuit assembly 100 having at least one integrated circuit device (illustrated as a first integrated circuit device $120_1$ and a second integrated circuit device $120_2$) electrically attached to an electronic substrate 110 in a configuration generally known as a flip-chip or controlled collapse chip connection ("C4") configuration, according to an embodiment of the present description.

The electronic substrate 110 may be any appropriate structure, including, but not limited to, an interposer. The electronic substrate 110 may have a first surface 112 and an opposing second surface 114. The electronic substrate 110 may comprise a plurality of dielectric material layers (not shown), which may include build-up films and/or solder resist layers, and may be composed of an appropriate dielectric material, including, but not limited to, bismaleimide triazine resin, fire retardant grade 4 material, polyimide material, silica filled epoxy material, glass reinforced epoxy material, and the like, as well as low-k and ultra low-k dielectrics (dielectric constants less than about 3.6), including, but not limited to, carbon doped dielectrics, fluorine doped dielectrics, porous dielectrics, organic polymeric dielectrics, and the like.

The electronic substrate 110 may further include conductive routes 118 or "metallization" (shown in dashed lines) extending through the electronic substrate 110. As will be understood to those skilled in the art, the conductive routes 118 may be a combination of conductive traces (not shown) and conductive vias (not shown) extending through the plurality of dielectric material layers (not shown). These conductive traces and conductive vias are well known in the art and are not shown in FIG. 1 for purposes of clarity. The conductive traces and the conductive vias may be made of any appropriate conductive material, including but not limited to, metals, such as copper, silver, nickel, gold, and aluminum, alloys thereof, and the like. As will be understood to those skilled in the art, the electronic substrate 110 may be a cored substrate or a coreless substrate.

The first integrated circuit device $120_1$ and the second integrated circuit device $120_2$ may be any appropriate device, including, but not limited to, a microprocessor, a chipset, a graphics device, a wireless device, a memory device, an application specific integrated circuit, a transceiver device, an input/output device, combinations thereof, stacks thereof, or the like. As shown in FIG. 1, the first integrated circuit device $120_1$ and the second integrated circuit device $120_2$ may each have a first surface 122, an opposing second surface 124, and at least one side 126 extending between the first surface 122 and the second surface 124. The first integrated circuit device $120_1$ and the second integrated circuit device $120_2$ may be a monolithic silicon die or plurality of molded composited dice. As such, the second surface 124 and the at least one side 126 of either or both the first integrated circuit device $120_1$ and the second integrated circuit device $120_2$ may include silicon, mold material, and/or metal.

As will be understood, when multiple integrated circuit devices are utilized, they may have different thicknesses. For example, as shown in FIG. 1, the first integrated circuit device $120_1$ and the second integrated circuit device $120_2$ may have differing thicknesses $T_1$ and $T_2$, respectively, that is measured from the first surface 122 to the second surface 124 of the first integrated circuit device $120_1$ and the second integrated circuit device $120_2$, respectively. The differing thicknesses $T_1$ and $T_2$ may result in differing heights $H_1$ and $H_2$ between the first integrated circuit device $120_1$ and the second integrated circuit device $120_2$, respectively, that is measured from the first surface 112 of the electronic substrate 110 to the second surface 124 of each of the first integrated circuit device $120_1$ and the second integrated circuit device $120_2$. In one embodiment, the difference between heights $H_1$ and $H_2$ may be between about 50 microns and 600 microns.

In an embodiment of the present description, the first integrated circuit device $120_1$ and the second integrated circuit device $120_2$ may be electrically attached to the electronic substrate 110 with a plurality of device-to-substrate interconnects 132. In one embodiment of the present description, the device-to-substrate interconnects 132 may extend between bond pads 136 on the first surface 112 of the electronic substrate 110 and bond pads 134 on the first surface 122 of the first integrated circuit device $120_1$ and on the first surface 122 of the second integrated circuit device $120_2$. The device-to-substrate interconnects 132 may be any appropriate electrically conductive material or structure, including, but not limited to, solder balls, metal bumps or pillars, metal filled epoxies, or a combination thereof. In one embodiment, the device-to-substrate interconnects 132 may be solder balls formed from tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). In another embodiment, the device-to-substrate interconnects 132 may be copper bumps or pillars. In a further embodiment, the device-to-substrate interconnects 132 may be metal bumps or pillars coated with a solder material.

The bond pads 134 may be in electrical communication with integrated circuitry (not shown) within their respective integrated circuit devices, i.e. the first integrated circuit device $120_1$ and the second integrated circuit device $120_2$. The bond pads 136 on the first surface 112 of the electronic substrate 110 may be in electrical contact with the conductive routes 118. The conductive routes 118 may extend through the electronic substrate 110 and be connected to bond pads 138 on the second surface 114 of the electronic substrate 110. As will be understood to those skilled in the art, the electronic substrate 110 may reroute a fine pitch (center-to-center distance between the bond pads) of the integrated circuit device bond pads 136 to a relatively wider pitch of the bond pads 138 on the second surface 114 of the electronic substrate 110. In one embodiment of the present description, external interconnects 140 may be disposed on the bond pads 138 on the second surface 114 of the electronic substrate 110. The external interconnects 140 may be any appropriate electrically conductive material, including, but not limited to, metal filled epoxies and solders, such as tin, lead/tin alloys (for example, 63% tin/37% lead solder), and high tin content alloys (e.g. 90% or more tin—such as tin/bismuth, eutectic tin/silver, ternary tin/silver/copper, eutectic tin/copper, and similar alloys). The external interconnects 140 may be used to attach the integrated circuit assembly 100 to an external substrate (not shown), such as a motherboard.

As further shown in FIG. 1, integrated circuit assembly 100 may further include a heat dissipation device 160, such as an integrated heat spreader, that may be thermally coupled with the second surface 124 of the first integrated circuit device 120$_1$ and the second surface 124 of the second integrated circuit device 120$_2$ with a thermal interface material 170. The heat dissipation device 160 may comprise a main body 162, having a first surface 164 and an opposing second surface 166, and at least one boundary wall 168 extending from the first surface 164 of the main body 162 of the heat dissipation device 160. The at least one boundary wall 168 may be attached or sealed to the first surface 112 of the electronic substrate 110 with the attachment adhesive or sealant layer 152.

The heat dissipation device 160 may be made of any appropriate thermally conductive material, including, but not limited to, at least one metal material and alloys of more than one metal, or highly doped glass or highly conductive ceramic material, such as aluminum nitride. In an embodiment of the present description, the heat dissipation device 160 may comprise copper, nickel, aluminum, alloys thereof, laminated metals including coated materials (such as nickel coated copper), and the like.

Figure 2:
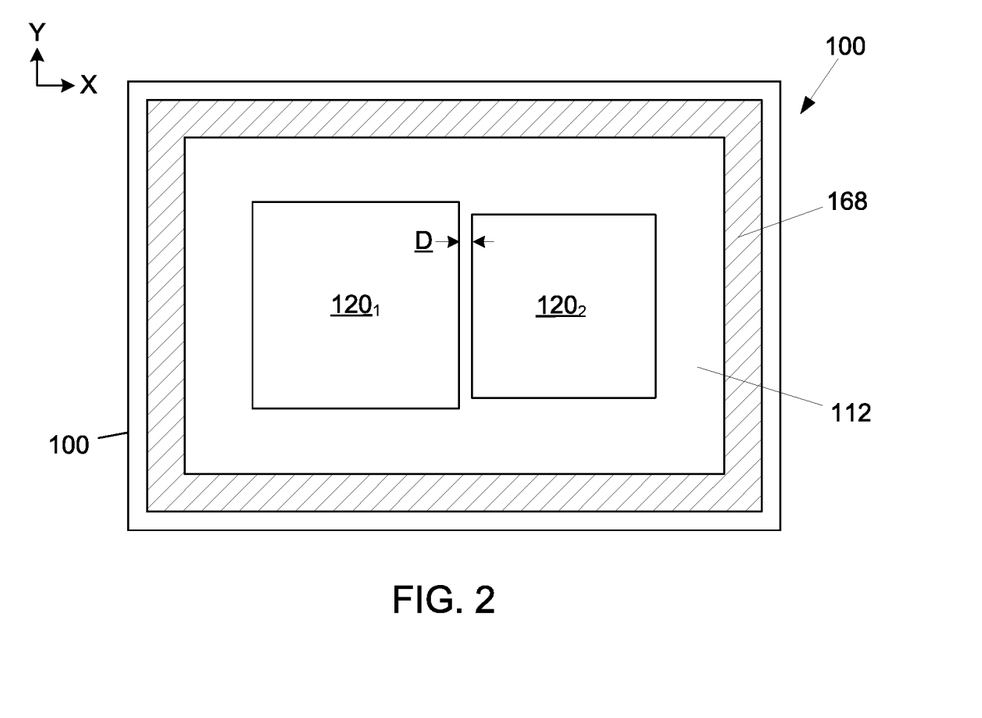
FIG. 2 is a cross-sectional view along line 2-2 of FIG. 1, according to an embodiment of the present description.

As illustrated in FIG. 1, the heat dissipation device 160 may be a single material throughout, such as when the heat dissipation device 160 including the heat dissipation boundary wall 168 is formed by a single process step, including but not limited to, stamping, skiving, molding, and the like. However, embodiments of the present description may also include heat dissipation device 160 made of more than one component. For example, the heat dissipation device boundary wall 168 may be formed separately from the main body 162, then attached together to form the heat dissipation device 160. In one embodiment, the boundary wall 168 may be a single "picture frame" structure surrounding the first integrated circuit device 120$_1$ and the second integrated circuit device 120$_2$, as shown in FIG. 2.

The attachment adhesive 152 may be any appropriate material, including, but not limited to, silicones (such as polydimethylsiloxane), epoxies, and the like. It is understood that the boundary wall 168 not only secures the heat dissipation device 160 to the substrate 110, but also helps to maintain a desired distance (e.g. bond line thickness $BLT_1$ and $BLT_2$) between the first surface 164 of the heat dissipation device 160 and second surfaces 124 of the integrated circuit devices 120$_1$, 120$_2$.

The heat dissipation device 160 may have additional thermal management devices (not shown) attached thereto for enhanced heat removal. Such additional thermal management devices (not shown) may include, but are not limited to, heat pipes, high surface area dissipation structures with a fan (such as a structure having fins or pillars/columns formed in a thermally conductive structure), liquid cooling devices, and the like, as will be understood to those skilled in the art.

In various embodiments of the present description, the thermal interface material 170 may be any appropriate, thermally conductive material, including, but not limited to, a thermal grease, a thermal gap pad, a polymer, an epoxy filled with high thermal conductivity fillers, such as metal particles or silicon particles, and the like. In one embodiment of the present description, the thermal interface material 170 may be a phase change material. A phase change material is a substance with a high heat of fusion, which, when it melts and solidifies, is capable of storing and releasing large amounts of thermal energy. In an embodiment of the present description, the phase change material may include, but is not limited to, nonadecane, decanoic (capric) acid, eicosane, dodecanoic (lauric) acid, docosane, paraffin wax, stearic acid, tetradecanoic (myristic) acid, octadecanol, hexadecanoic (palmitic) acid, and metallic alloys which include one or more of bismuth, lead, tin, cadmium, antimony, indium, thallium, tellurium, selenium, gallium, mercury, and combinations thereof.

Prior to the attachment of the heat dissipation device 160, an electrically-insulating underfill material 142 may be disposed between the first integrated circuit device 120$_1$ and the electronic substrate 110, and between the second integrated circuit device 120$_2$ and the electronic substrate 110, which substantially encapsulates the interconnects 122. The underfill material 142 may be used to reduce mechanical stress issues that can arise from thermal expansion mismatch between the electronic substrate 110 and the integrated circuit devices 120$_1$ and 120$_2$. The underfill material 142 may be an epoxy material, including, but not limited to epoxy, cyanoester, silicone, siloxane and phenolic based resins, that has sufficiently low viscosity to be wicked between the integrated circuit devices 120$_1$, 120$_2$ and the electronic substrate 110 by capillary action when introduced by an underfill material dispenser (not shown), which will be understood to those skilled in the art. The underfill material 142 may be subsequently cured (hardened), such as by heat or radiation.

Figure 3:
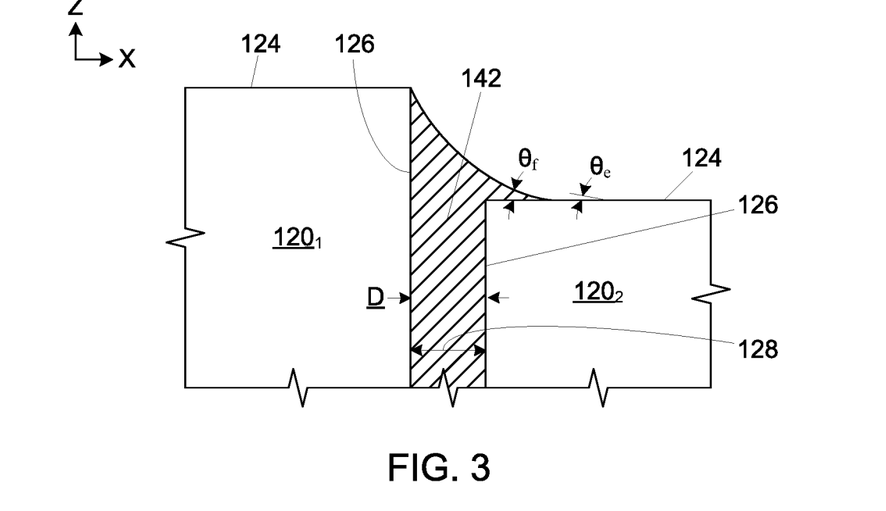
FIG. 3 is a side cross-sectional view of an underfill material between two integrated circuit devices, according to an embodiment of the present description.

With the pressure to decrease the size of the integrated circuit packages or assemblies 100, an interconnect pitch (e.g. distance between adjacent device-to-substrate interconnects 132) and an interconnect height (e.g. distance between the first surface 122 of the integrated circuit devices 120$_1$, 120$_2$ and the first surface 112 of the electronic substrate 110) has decreased. Furthermore, as shown in FIGS. 1 and 2, a distance D of a gap 128 between adjacent integrated circuit devices, shown as the first integrated circuit device 120$_1$ and the second integrated circuit device 120$_2$, has also decreased, such as between about 25 microns and 500 microns. It has become successively more difficult to obtain adequate underfill material dispersion without continuously decreasing the viscosity of the underfill material 142 or improving its wettability properties, as will be understood to those skilled in the art. However, decreasing the viscosity and/or improving the wettability of the underfill material 142 results in the underfill material 142 wicking into the gap 128 and bleeding out onto the second surface 124 of the second integrated circuit device 120$_2$, as its height $H_2$ (see FIG. 1) is less than the height $H_1$ of the first integrated circuit device 120$_1$ (see FIG. 1), as shown in FIG. 3. This bleed out occurs when a fillet angle $\theta_f$ of the underfill material 142 reaches an equilibrium contact angle $\theta_e$ (usually between about 10 and 20 degrees for silicon material) on the second surface 124 of the second integrated circuit device $120_2$, wherein the underfill material 142 will start to wick along the second surface 124 of the second integrated circuit device $120_2$, as will be discussed. This bleed-out of the underfill material 142 may be a problem as it can cover surface area on the second surface 124 of the second integrated circuit device $120_2$ that is needed for the removal of heat therefrom. Since the thermal conductivity of materials used for the underfill materials 142 is generally considerably lower than the thermal conductivity of the thermal interface material 170 (see FIG. 1), such encroachment can significantly reduce heat removal from the second integrated circuit device $120_2$. Furthermore, the interface between the underfill material 142 and the thermal interface material 170 can initiate delamination, causing further a degradation in thermal performance, as previously discussed.

Figure 4:
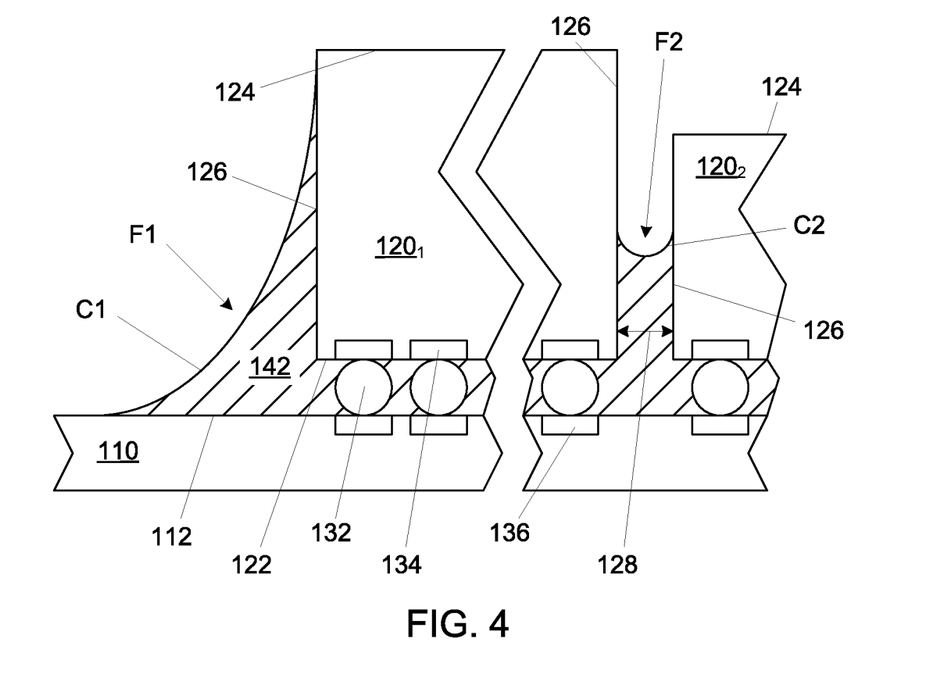
FIGS. 4-6 are side cross-sectional views of a sequence of steps in the dispensation of an underfill material, according to an embodiment of the present description.
Figure 5:
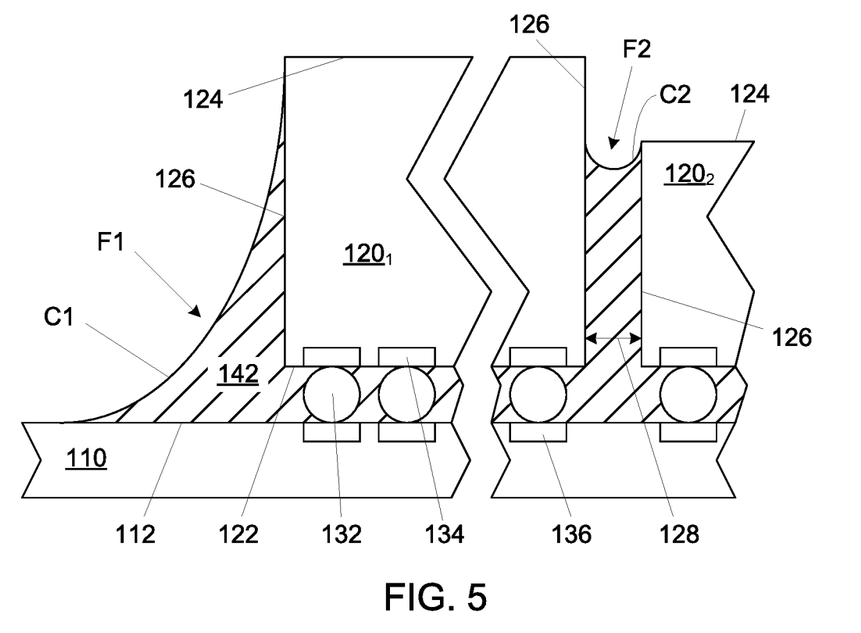
Figure 6:
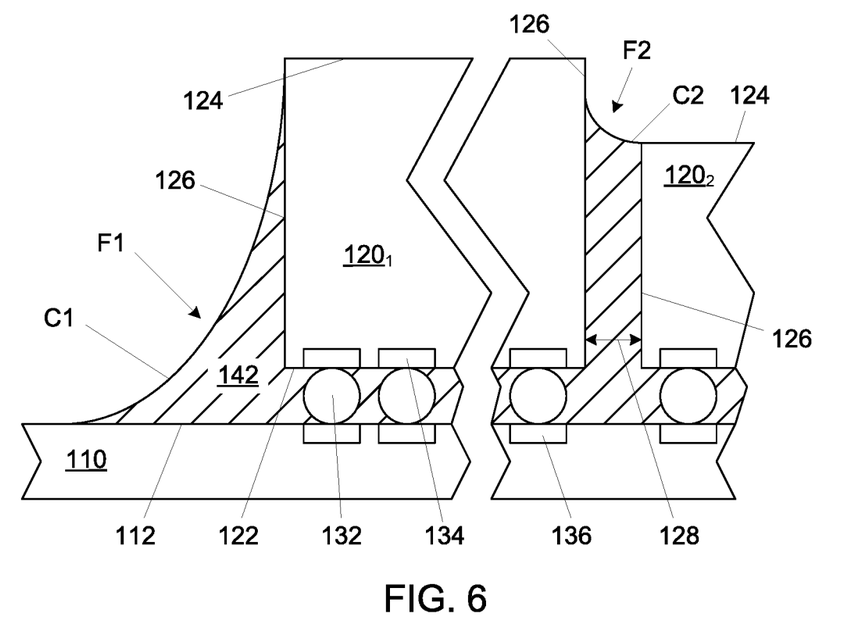

FIGS. 4 to 6 illustrate the mechanism of underfill material 142 encroachment when there is a height difference between integrated circuit devices, such as the first integrated circuit device $120_1$ and the second integrated circuit device $120_2$, in an integrated circuit assembly 100 shown in FIG. 1. As shown in FIG. 4, when the underfill material 142 is introduced between the first surface 122 of the first integrated circuit device $120_1$ and the first surface 112 for the electronic substrate 110, a first fillet F1 will form, which extends between the at least one side 126 of the first integrated circuit device $120_1$ and the first surface 112 of the electronic substrate 110. As will be understood to those skilled in the art, the surface capillary pressure of the first fillet F1 is negative and the absolute value of this pressure is proportional to the curvature C1 of the first fillet F1. As the underfill material 142 is first introduced, a second fillet F2 will form between the first integrated circuit device $120_1$ and the second integrated circuit device $120_2$, and will initially be below the second surface 124 of the second integrated circuit device $120_2$, as shown in FIG. 4. The surface capillary pressure of the second fillet F2 will, of course, be much smaller than the surface capillary pressure of the first fillet F1 because of the large curvature C2 (smaller radius) of the second fillet F2 in the gap 128 between the first integrated circuit device $120_1$ and the second integrated circuit device $120_2$, as will be understood to those skilled in the art. As the underfill material 142 is added, the surface capillary pressure difference between the first fillet F1 and the second fillet F2 will drive the underfill material 142 in the gap 128 toward the second surface 124 of the second integrated circuit device $120_2$, and, even when the underfill material 142 reaches the second surface 124 of the first integrated circuit device $120_1$, as shown in FIG. 5, the surface capillary pressure of the second fillet F2 will still be much smaller than the surface capillary pressure of the first fillet F1. As further underfill material 142 is added, the surface capillary pressure difference between the first fillet F1 and the second fillet F2 will drive the underfill material 142 in the gap 128 along the side 126 of first integrated circuit device $120_1$ toward the second surface 124 thereof, and the surface capillary pressure difference between the first fillet F1 and the second fillet F2 will decrease the closer the underfill material 142 gets to the second surface 124 of the first integrated circuit device $120_1$, as shown in FIG. 6. At the same time, the fillet angle $\theta_f$ (see FIG. 3) between second fillet F2 and the second surface 124 of the second integrated circuit device $120_2$ will become larger. Again, once the fillet angle $\theta_f$ (see FIG. 3) reaches an equilibrium contact angle $\theta_e$ (see FIG. 3) on the second surface 124 of the second integrated circuit device $120_2$, the underfill material 124 will start to wick along the second surface 124 of the second integrated circuit device $120_2$, as shown back in FIG. 3, and resulting in the issues associated therewith.

As shown in FIGS. 7-12, to prevent the encroachment of the underfill material 142 onto the second surface 124 of the second integrated circuit device $120_2$, at least one barrier structure 180 may be formed adjacent an edge $E_1$ of the first integrated circuit device $120_1$ and/or adjacent an edge $E_2$ of the second integrated circuit device $120_2$, wherein the underfill material 142 abuts the at least one barrier structure 180. The edge $E_1$ of the first integrated circuit device $120_1$ may be defined at an intersection of the second surface 124 and the at least one side 126 of the first integrated circuit device $120_1$. The edge $E_2$ of the second integrated circuit device $120_2$ may be defined at an intersection of the second surface 124 and the at least one side 126 of the second integrated circuit device $120_2$.

Figure 7:
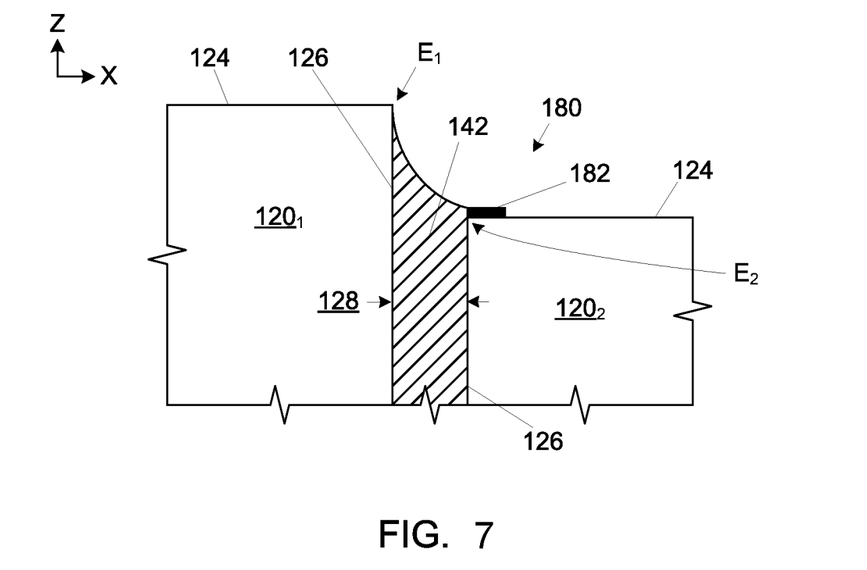
FIGS. 7-10 are views of the use of a hydrophobic material as a barrier structure, according to one embodiment of the present description.
Figure 8:
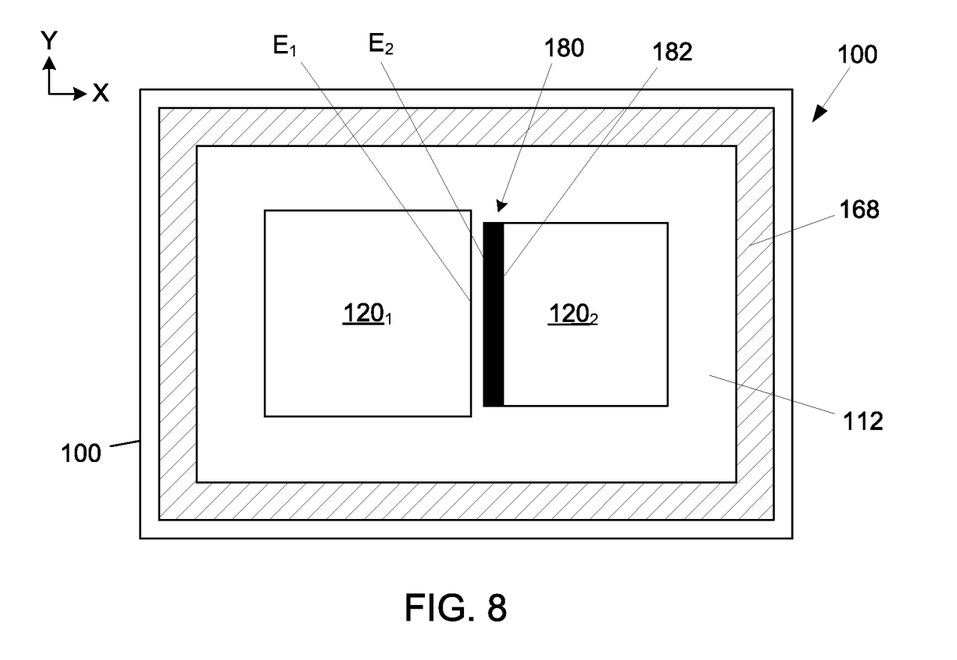
Figure 9:
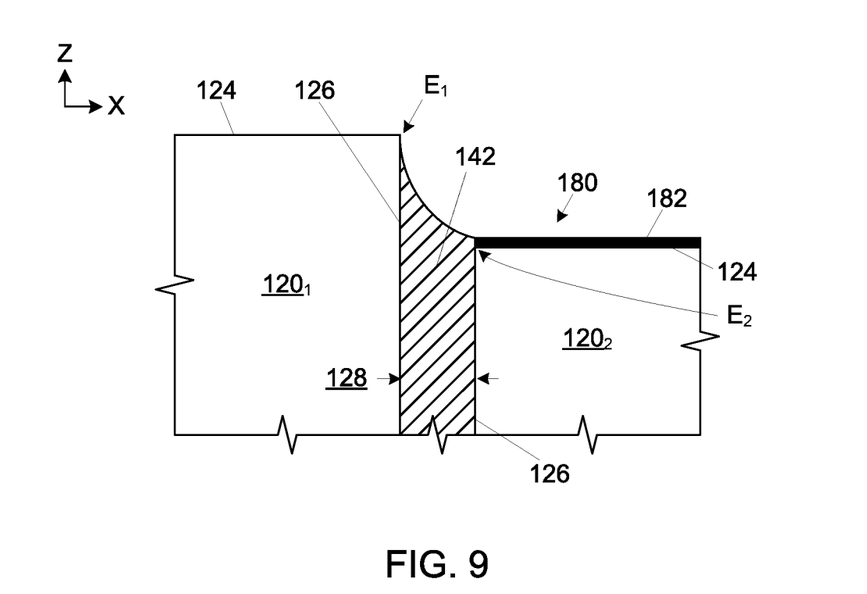

In one embodiment of the present description as shown in FIGS. 7 and 8, the barrier structure 180 may comprise a hydrophobic material layer 182, which may comprise a strip disposed along the edge $E_2$ of the second integrated circuit device $120_2$. A hydrophobic material is generally a nonpolar material with a low affinity to (repels) water. Of course, the barrier structure 180 of the present description is not limited to any specific shape or position, but may be any position or shape that with effectively prevent the encroachment of the underfill material 142 onto the second surface 124 of the second integrated circuit device $120_2$. In one example, the entire second surface 124 of the second integrated circuit device $120_2$ may be coated with the hydrophobic material 182 to form the barrier structure 180, as shown in FIG. 9. As will be understood by those skilled in the art, the use of a hydrophobic material layer 182 as the barrier structure 180 effectively changes the equilibrium contact angle of the second surface 124 of the second integrated circuit device $120_2$ to over about 70 degrees. Thus, the underfill material 142 cannot wet the second surface 124 of the second integrated circuit device $120_2$.

In a further embodiment of the present description, the barrier structure 180 may comprise the hydrophobic material layer 182 on the side 126 of the first integrated circuit device $120_1$ above the second surface 124 of the second integrated circuit device $120_2$. As with the previous embodiment, the barrier structure 180 effectively changes the contact angle of the side 126 of the first integrated circuit device $120_1$, such that the underfill material 142 will not wet up the side 126 of the first integrated circuit device $120_1$, and, thus, the underfill material 142 will not come into equilibrium with the contact angle $\theta_e$ of the second surface 124 of the second integrated circuit device $120_2$, and, therefore will not wet the second surface 124 of the second integrated circuit device $120_2$.

The hydrophobic material layer 182 may comprise any appropriate material, including, but not limited to, silicones, fluorocarbons, silicone and/or fluorocarbon filled polymer composites, and the like. The hydrophobic material layer 182 may be formed by any known technique, including, but not limited to, spin coating, spray coating, lamination, dispense, printing, and the like. The hydrophobic material layer 182 may be formed at any point in the fabrication process prior to the disposition of the underfill material 142.

Figure 10:
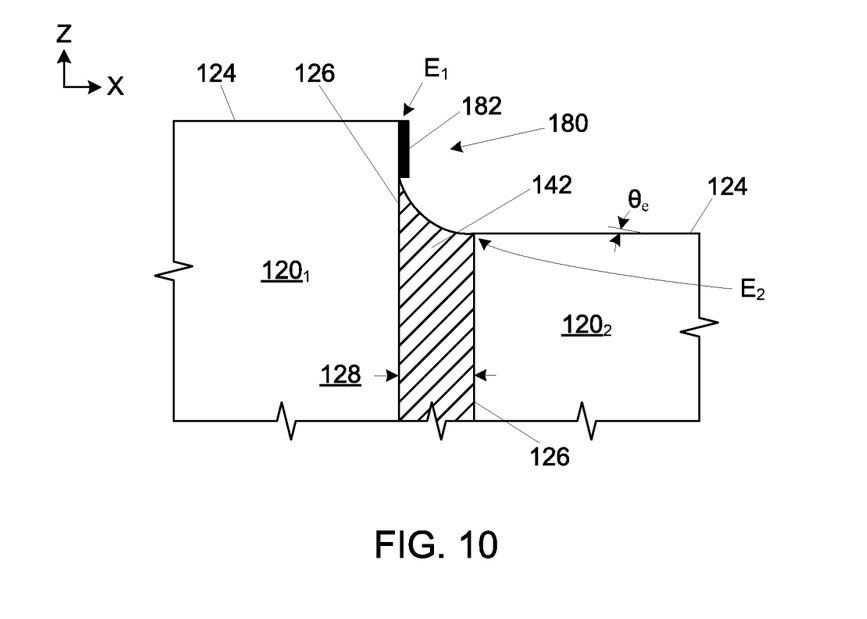
Figure 11:
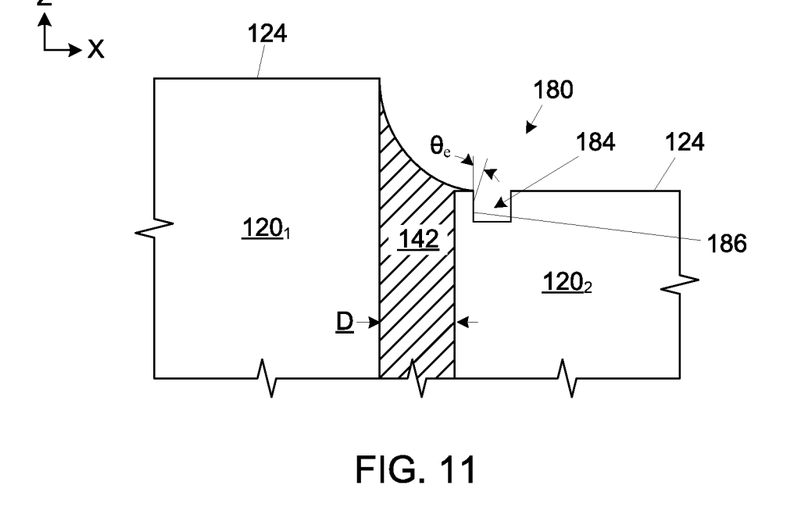
FIGS. 11 and 12 are side cross-sectional views of the use of at least one trench as a barrier structure, according to another embodiment of the present description.

In another embodiment of the present description, as shown in FIGS. 10 and 11, the barrier structure 180 may comprise at least one trench 184 extending along the edge $E_2$ of the second integrated circuit device $120_2$. As will be understood to those skilled in the art, the underfill material 142 may flow to the at least one trench 184 when the fillet angle θf (shown in FIG. 3) reaches an equilibrium contact angle θe (shown in FIG. 3) on the second surface 124 of the second integrated circuit device $120_2$, as shown in FIG. 3, but at the trench 184, the surface for the equilibrium contact angle θe will shift to at least one sidewall 186 of the at least one trench 184. In order to flow over the trench 184, the underfill material 142 would have to have such a pressure that it would "bulge" over and wet the sidewall 186 of the trench 184. Such a condition would require a dramatic over-dispensation of underfill material 142, which would not occur in the normal fabrication processes. Thus, the underfill material 142 would not wet the second surface 124 of the second integrated circuit device $120_2$ beyond the at least one trench 184. Of course, the at least one trench 184 of the present description is not limited to any specific shape or position, but may be any position or shape that with effectively prevent the encroachment of the underfill material 142 onto the second surface 124 of the second integrated circuit device $120_2$.

Figure 12:
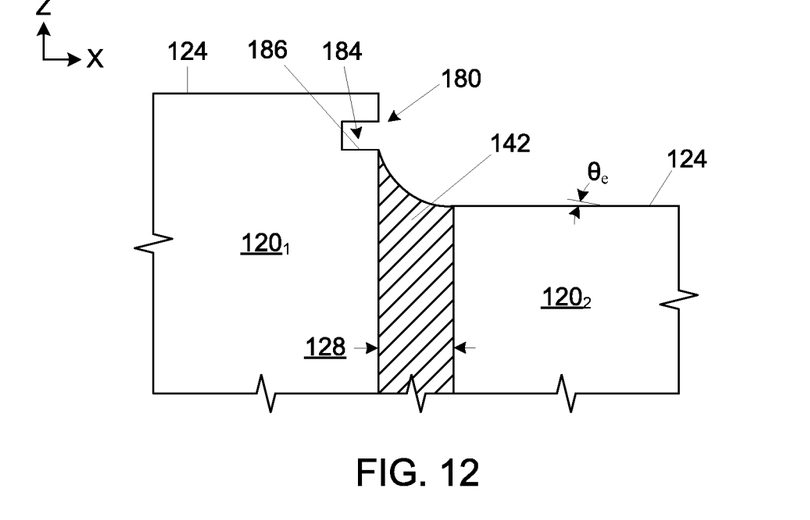

In a further embodiment of the present description, the barrier structure 180 may comprise at least one trench 184 on the side 126 of the first integrated circuit device $120_1$ above the second surface 124 of the second integrated circuit device $120_2$, as shown in FIG. 12. As with the previous embodiment, the barrier structure 180 effectively changes the contact angle of the side 126 of the first integrated circuit device $120_1$, to at least one sidewall 186 of the at least one trench 184, such that the underfill material 142 will not wet up the side 126 of the first integrated circuit device $120_1$, and, thus, the underfill material 142 will not come into equilibrium with the contact angle θe of the second surface 124 of the second integrated circuit device $120_2$, and, therefore will not wet the second surface 124 of the second integrated circuit device $120_2$.

The trench 184 may be formed by any known technique, including, but not limited to, laser drilling, ion ablation, etching, and the like. The at least one trench 184 may be formed at any point prior to the disposition of the underfill material 142.

Figure 13:
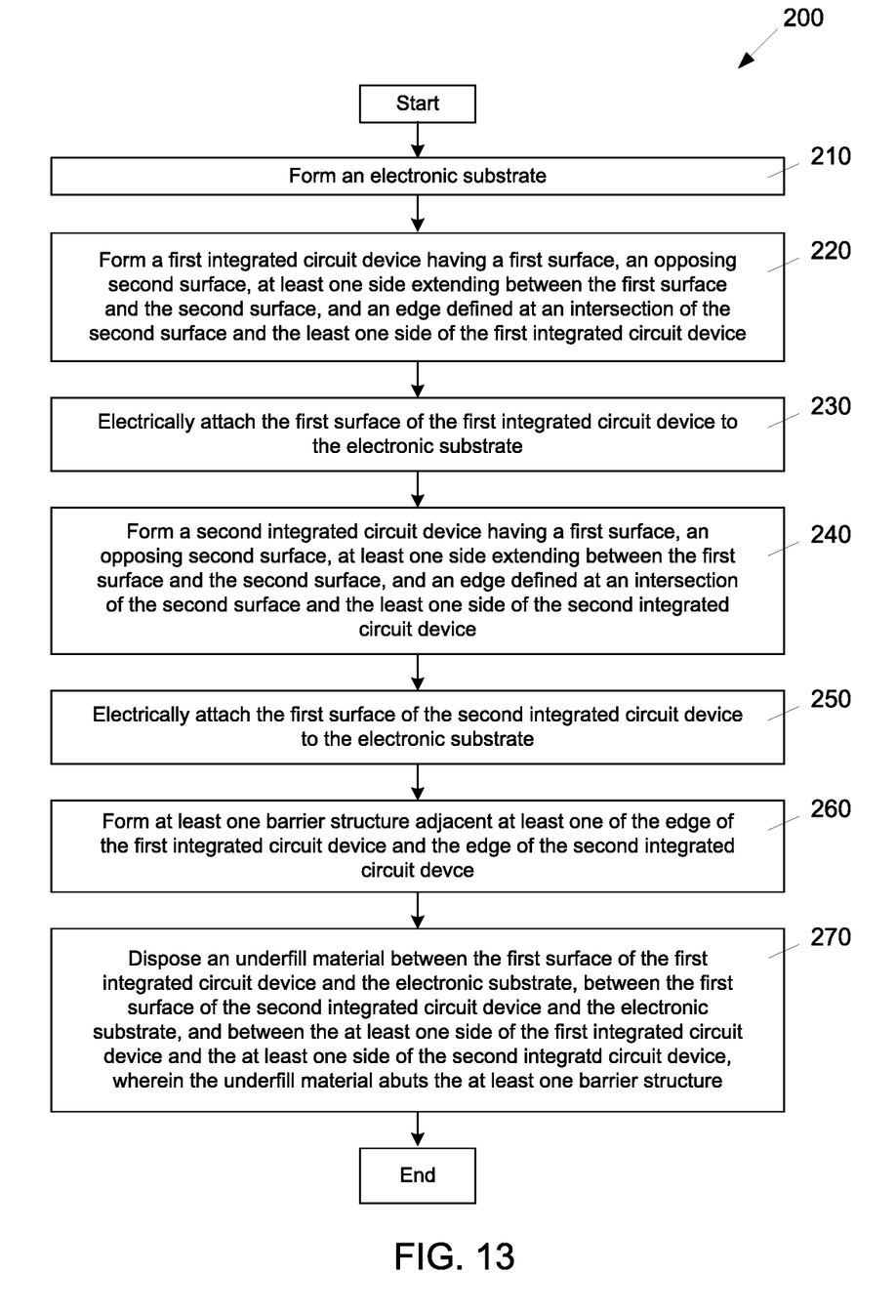
FIG. 13 is a flow chart of a process of fabricating an integrated circuit package, according to an embodiment of the present description.

FIG. 13 is a flow chart of a process 200 of fabricating an integrated circuit assembly according to an embodiment of the present description. As set forth in block 210, an electronic substrate may be formed. A first integrated circuit device may be formed having a first surface, an opposing second surface, at least one side extending between the first surface and the second surface, and an edge defined at an intersection of the second surface and the at least one side of the first integrated circuit device, as set forth in block 220. As set forth in block 230, the first surface of the first integrated circuit device may be electrically attached to the electronic substrate. A second integrated circuit device may be formed having a first surface, an opposing second surface, at least one side extending between the first surface and the second surface, and an edge defined at an intersection of the second surface and the at least one side of the second integrated circuit device, as set forth in block 240. As set forth in block 250, the first surface of the second integrated circuit device may be electrically attached to the electronic substrate. At least one barrier structure may be formed adjacent at least one of the edge of first integrated circuit device and the edge of the second integrated circuit device, as set forth in block 260. As set forth in block 270, an underfill material may be disposed between the first surface of the first integrated circuit device and the electronic substrate, between the first surface of the second integrated circuit device and the electronic substrate, and between the at least one side of the first integrated circuit device and the at least one side of the second integrated circuit device, wherein the underfill material abuts the at least one barrier structure.

Figure 14:
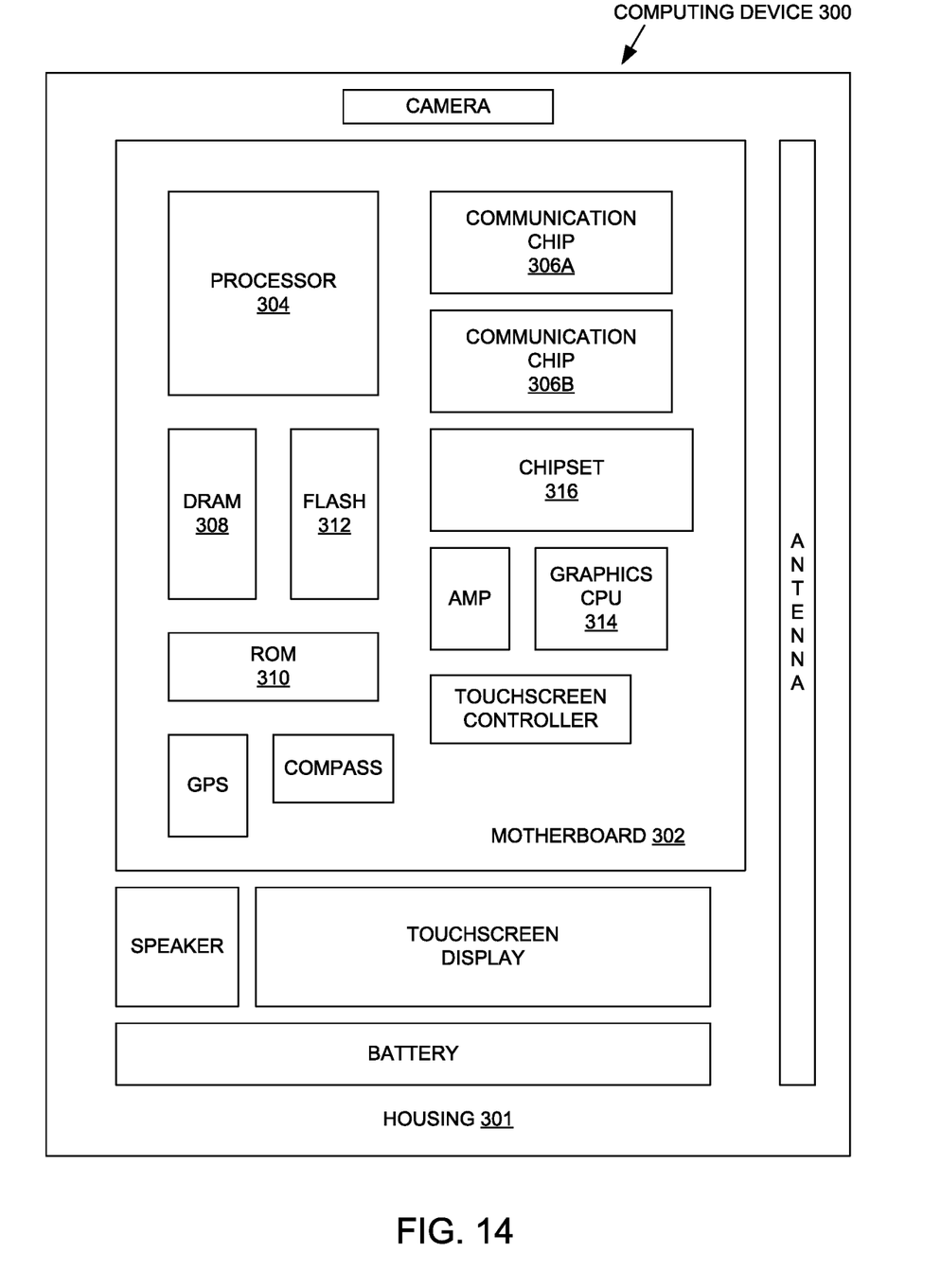
FIG. 14 is an electronic system, according to one embodiment of the present description.

FIG. 14 illustrates an electronic or computing device 300 in accordance with one implementation of the present description. The computing device 300 may include a housing 301 having a board 302 disposed therein. The computing device 300 may include a number of integrated circuit components, including but not limited to a processor 304, at least one communication chip 306A, 306B, volatile memory 308 (e.g., DRAM), non-volatile memory 310 (e.g., ROM), flash memory 312, a graphics processor or CPU 314, a digital signal processor (not shown), a crypto processor (not shown), a chipset 316, an antenna, a display (touchscreen display), a touchscreen controller, a battery, an audio codec (not shown), a video codec (not shown), a power amplifier (AMP), a global positioning system (GPS) device, a compass, an accelerometer (not shown), a gyroscope (not shown), a speaker, a camera, and a mass storage device (not shown) (such as hard disk drive, compact disk (CD), digital versatile disk (DVD), and so forth). Any of the integrated circuit components may be physically and electrically coupled to the board 302. In some implementations, at least one of the integrated circuit components may be a part of the processor 304.

The communication chip enables wireless communications for the transfer of data to and from the computing device. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device may include a plurality of communication chips. For instance, a first communication chip may be dedicated to shorter range wireless communications such as Wi-Fi and Bluetooth and a second communication chip may be dedicated to longer range wireless communications such as GPS, EDGE, GPRS, CDMA, WiMAX, LTE, Ev-DO, and others.

The term "processor" may refer to any device or portion of a device that processes electronic data from registers and/or memory to transform that electronic data into other electronic data that may be stored in registers and/or memory.

At least one of the integrated circuit components may include an integrated circuit assembly comprising an electronic substrate, a first integrated circuit device electrically having a first surface, an opposing second surface, at least one side extending between the first surface and the second surface, and an edge defined at an intersection of the second surface and the at least one side of the first integrated circuit device, a second integrated circuit device electrically having a first surface, an opposing second surface, at least one side extending between the first surface and the second surface, and an edge defined at an intersection of the second surface and the at least one side of the second integrated circuit device, an underfill material between the first surface of the first integrated circuit device and between the first surface of the second integrated circuit device, between the at least one side of the first integrated circuit device, and between the at least one side of the second integrated circuit device, and at least one barrier structure adjacent at least one of the edge of first integrated circuit device and the edge of the second integrated circuit device, wherein the underfill material abuts the at least one barrier structure.

In various implementations, the computing device may be a laptop, a netbook, a notebook, an ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device may be any other electronic device that processes data.

It is understood that the subject matter of the present description is not necessarily limited to specific applications illustrated in FIGS. 1-14. The subject matter may be applied to other integrated circuit devices and assembly applications, as well as any appropriate electronic application, as will be understood to those skilled in the art.

The following examples pertain to further embodiments and specifics in the examples may be used anywhere in one or more embodiments, wherein Example 1 is an integrated circuit structure comprising an integrated circuit device having a first surface, an opposing second surface, at least one side extending between the first surface and the second surface, and an edge defined at an intersection of the second surface and the at least one side of the integrated circuit device; and at least one barrier structure adjacent to the edge of the integrated circuit device.

In Example 2, the subject matter of Example 1 can optionally include the at least one barrier structure comprising at least one hydrophobic material layer.

In Example 3, the subject matter of Example 1 can optionally include the at least one barrier structure comprising at least one trench formed in the integrated circuit device.

In Example 4, the subject matter of Example 1 can optionally include the at least one barrier structure being on the at least one side of the integrated circuit device.

In Example 5, the subject matter of Example 1 can optionally include the at least one barrier structure being on the second surface of the integrated circuit device.

Example 6 is an integrated circuit assembly comprising an electronic substrate, a first integrated circuit device electrically having a first surface, an opposing second surface, at least one side extending between the first surface and the second surface, and an edge defined at an intersection of the second surface and the at least one side of the first integrated circuit device, a second integrated circuit device electrically having a first surface, an opposing second surface, at least one side extending between the first surface and the second surface, and an edge defined at an intersection of the second surface and the at least one side of the second integrated circuit device, an underfill material between the first surface of the first integrated circuit device and the electronic substrate, between the first surface of the second integrated circuit device and the electronic substrate, and between the at least one side of the first integrated circuit device and the at least one side of the second integrated circuit device, and at least one barrier structure adjacent at least one of the edge of first integrated circuit device and the edge of the second integrated circuit device, wherein the underfill material abuts the at least one barrier structure.

In Example 7, the subject matter of Example 6 can optionally include a height of the first integrated circuit device is greater than a height of the second integrated circuit device.

In Example 8, the subject matter of any of Example 6 to 7 can optionally include the at least one barrier structure comprising at least one hydrophobic material layer.

In Example 9, the subject matter of any of Example 6 to 7 can optionally include the at least one barrier structure comprising at least one trench.

In Example 10, the subject matter of any of Example 6 to 9 can optionally include the at least one barrier structure being on the at least one side of the first integrated circuit device.

In Example 11, the subject matter of any of Examples 6 to 10 can optionally include the at least one barrier structure being on the second surface of the second integrated circuit device.

In Example 12, the subject matter of Example 11 can optionally include the at least one barrier structure comprising a hydrophobic material layer covering the second surface of the second integrated circuit device.

In Example 13, the subject matter of Example 12 can optionally include a heat dissipation device in thermal contact with the second surface of the first integrated circuit device and the second surface of the second integrated circuit device, and a thermal interface material between the first integrated circuit device and the heat dissipation device and between the second integrated circuit device and the heat dissipation device.

Example 14 is an electronic system, comprising an electronic board and an integrated circuit assembly electrically attached to the electronic board, wherein the integrated circuit assembly comprises an electronic substrate, a first integrated circuit device electrically having a first surface, an opposing second surface, at least one side extending between the first surface and the second surface, and an edge defined at an intersection of the second surface and the at least one side of the first integrated circuit device, a second integrated circuit device electrically having a first surface, an opposing second surface, at least one side extending between the first surface and the second surface, and an edge defined at an intersection of the second surface and the at least one side of the second integrated circuit device, an underfill material between the first surface of the first integrated circuit device and the electronic substrate, between the first surface of the second integrated circuit device and the electronic substrate, and between the at least one side of the first integrated circuit device and the at least one side of the second integrated circuit device, and at least one barrier structure adjacent at least one of the edge of first integrated circuit device and the edge of the second integrated circuit device, wherein the underfill material abuts the at least one barrier structure.

In Example 15, the subject matter of Example 6 can optionally include a height of the first integrated circuit device is greater than a height of the second integrated circuit device.

In Example 16, the subject matter of any of Example 14 to 15 can optionally include the at least one barrier structure comprising at least one hydrophobic material layer.

In Example 17, the subject matter of any of Example 14 to 15 can optionally include the at least one barrier structure comprising at least one trench.

In Example 18, the subject matter of any of Example 14 to 17 can optionally include the at least one barrier structure being on the at least one side of the first integrated circuit device.

In Example 19, the subject matter of any of Examples 14 to 18 can optionally include the at least one barrier structure being on the second surface of the second integrated circuit device.

In Example 20, the subject matter of Example 19 can optionally include the at least one barrier structure comprising a hydrophobic material layer covering the second surface of the second integrated circuit device.

In Example 21, the subject matter of any of Examples 14 to 20 can optionally include a heat dissipation device in thermal contact with the second surface of the first integrated circuit device and the second surface of the second integrated circuit device, and a thermal interface material between the first integrated circuit device and the heat dissipation device and between the second integrated circuit device and the heat dissipation device.

Having thus described in detail embodiments of the present invention, it is understood that the invention defined by the appended claims is not to be limited by particular details set forth in the above description, as many apparent variations thereof are possible without departing from the spirit or scope thereof.

What is claimed is:

1. An integrated circuit assembly, comprising:
   an electronic substrate;
   a first integrated circuit device having a first surface, an opposing second surface, a first side extending between the first surface and the second surface, and a first edge defined at an intersection of the second surface and the first side of the first integrated circuit device, wherein the first surface of the first integrated circuit device is electrically attached to the electronic substrate;
   a second integrated circuit device having a first surface, an opposing second surface, and a second side extending between the first surface and the second surface, and a second edge defined at an intersection of the second surface and the second side of the second integrated circuit device, wherein the first surface of the second integrated circuit device is electrically attached to the electronic substrate;
   an underfill material between the first side of the first integrated circuit device and the second side of the second integrated circuit device; and
   a trench within at least one of the first side of the first integrated circuit device or the second surface of the second integrated circuit device, the trench adjacent to, but laterally spaced a first distance apart from, the first edge or second edge, wherein the underfill material does not fill the trench.

2. The integrated circuit assembly of claim 1, wherein a height of the first integrated circuit device is greater than a height of the second integrated circuit device.

3. The integrated circuit assembly of claim 2, wherein the trench is substantially free of the underfill material.

4. The integrated circuit assembly of claim 2, wherein the trench is within the second surface of the second integrated circuit device and wherein, over at least a portion of the first distance, the underfill is in contact with the second surface of the second integrated circuit device.

5. The integrated circuit assembly of claim 1, further comprising a heat dissipation device in thermal contact with the second surface of the first integrated circuit device and the second surface of the second integrated circuit device, and a thermal interface material between the first integrated circuit device and the heat dissipation device and between the second integrated circuit device and the heat dissipation device.

6. The integrated circuit assembly of claim 1,
   wherein the edge has a length, the trench extends along at least a majority of the length.

7. The integrated circuit assembly of claim 1, wherein the at least one side is a first side, the edge is a first edge, the second surface comprises the trench within a first distance from the first edge, and the integrated circuit device comprises:
   a second side, opposite the first side and extending between the first surface and the second surface; and
   a second edge is defined at an intersection of the second surface and the second side, and wherein, within the first distance from the second edge, the trench is absent from the second surface.

8. The integrated circuit assembly of claim 1, wherein the side of the integrated circuit device comprises the trench.

9. The integrated circuit assembly of claim 1, wherein the second surface of the integrated circuit device comprises the trench.

10. An electronic system, comprising:
    a motherboard;
    an integrated circuit assembly electrically attached to the motherboard, wherein the integrated circuit assembly comprises:
      an electronic substrate;
      a first integrated circuit device having a first surface, an opposing second surface, a first side extending between the first surface and the second surface, and a first edge defined at an intersection of the second surface and the first side of the first integrated circuit device, wherein the first surface of the first integrated circuit device is electrically attached to the electronic substrate;
      a second integrated circuit device having a first surface, an opposing second surface, a second side extending between the first surface and the second surface, and a second edge defined at an intersection of the second surface and the second side of the second integrated circuit device, wherein the first surface of the second integrated circuit device is electrically attached to the electronic substrate,
      an underfill material between the first side of the first integrated circuit device and the second side of the second integrated circuit device; and
      at least one barrier structure comprising a silicone or fluorocarbon layer on the first side of the first integrated circuit device and adjacent the first edge or on the second surface of the second integrated circuit device and adjacent the second edge, wherein the underfill material abuts, but does not cross, the at least one barrier structure.

11. The electronic system of claim 10, wherein a height of the first integrated circuit device is greater than a height of the second integrated circuit device.

12. The electronic system of claim 10, wherein the at least one barrier structure is on the at least one side of the first integrated circuit device.

13. The electronic system of claim 10, wherein the at least one barrier structure is on the second surface of the second integrated circuit device.

* * * * *